United States Patent
Huang et al.

(10) Patent No.: US 8,513,067 B2
(45) Date of Patent: Aug. 20, 2013

(54) FABRICATION METHOD FOR SURROUNDING GATE SILICON NANOWIRE TRANSISTOR WITH AIR AS SPACERS

(75) Inventors: Ru Huang, Beijing (CN); Jing Zhuge, Beijing (CN); Jiewen Fan, Beijing (CN); Yujie Ai, Beijing (CN); Runsheng Wang, Beijing (CN); Xin Huang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/266,791

(22) PCT Filed: Jul. 15, 2011

(86) PCT No.: PCT/CN2011/077213
§ 371 (c)(1),
(2), (4) Date: Oct. 28, 2011

(87) PCT Pub. No.: WO2012/159329
PCT Pub. Date: Nov. 29, 2012

(65) Prior Publication Data
US 2013/0017654 A1    Jan. 17, 2013

(30) Foreign Application Priority Data
May 26, 2011 (CN) .......................... 2011 1 0139453

(51) Int. Cl.
*H01L 21/84* (2006.01)

(52) U.S. Cl.
USPC ...................... 438/157; 438/211; 257/E21.41

(58) Field of Classification Search
USPC ................. 438/151, 157, 211; 257/E21.409, 257/E21.41
See application file for complete search history.

(56) References Cited

U.S. PATENT DOCUMENTS

| 7,858,481 B2 * | 12/2010 | Brask et al. ............... 438/299 |
| 7,923,314 B2 * | 4/2011 | Tezuka et al. ............ 438/157 |

(Continued)

FOREIGN PATENT DOCUMENTS

CN     1577734     2/2005

OTHER PUBLICATIONS

PCT Notification of Transmittal of the International Search Report (Nov. 17, 2011); (PCT CN2011/077213).

*Primary Examiner* — Tuan N. Quach
(74) *Attorney, Agent, or Firm* — Patton Boggs LLP

(57) ABSTRACT

The invention discloses a fabrication method for a surrounding gate silicon nanowire transistor with air as spacers. The method comprises: performing isolation, and depositing a material A which has a higher etch selectivity ratio with respect to Si; performing photolithography to define a Fin hard mask; etching the material A to form the Fin hard mask; performing source and drain implantation; performing photolithography to define a channel region and large source/drain regions; forming the Si Fin and the large source/drains; removing the hard mask of the material A; forming a nanowire; etching the SiO$_2$ to form a floating nanowire; forming a gate oxide layer; depositing a polysilicon; performing polysilicon injection; performing annealing to activate dopants; etching the polysilicon; depositing SiN; performing photolithography to define a gate pattern; etching the SiN and the polysilicon to form the gate pattern; separating the gate and the source/drain with a space in between filled with air; depositing SiO$_2$ to form air sidewalls; performing annealing to densify the SiO$_2$ layer; using subsequent processes to complete the device fabrication. The invention is compatible with the CMOS process flow. The introduction of the air sidewalls can effectively reduce the parasitic capacitance of the device, and improve the transient response of the device, so that the method is applicable for a logic circuit with high performance.

9 Claims, 6 Drawing Sheets

(56) References Cited

U.S. PATENT DOCUMENTS

| | | |
|---|---|---|
| 8,173,993 B2 * | 5/2012 | Bangsaruntip et al. ......... 257/38 |
| 2004/0166642 A1 | 8/2004 | Chen et al. |
| 2007/0017439 A1 | 1/2007 | Xianyu et al. |
| 2008/0128760 A1 | 6/2008 | Jun et al. |
| 2008/0246021 A1 | 10/2008 | Suk et al. |
| 2008/0254579 A1 | 10/2008 | Chi et al. |

* cited by examiner (a)          (b)

(c)

ized circuit fabrication technology, particularly relates to a fabrication method for a surrounding gate silicon nanowire transistor with air as spacers.

FABRICATION METHOD FOR SURROUNDING GATE SILICON NANOWIRE TRANSISTOR WITH AIR AS SPACERS

CROSS-REFERENCE TO RELATED APPLICATION

The present application is a U.S. National Stage application of PCT application (PCT/CN2011/077213). The PCT application claims priority to Chinese Patent Application (No. 201110139453.9) filed on May 26, 2011, which is incorporated herein by reference in its entirety as if set forth herein.

FIELD OF THE INVENTION

The invention refers to a field of ultra large scale integrated (ULSI) circuit fabrication technology, particularly relates to a fabrication method for a surrounding gate silicon nanowire transistor with air as spacers.

BACKGROUND OF THE INVENTION

As the feature size of a CMOS device gradually shrinks, it enters into a deep submicron and a nanometer regime. However, its parasitic capacitance, especially a fringing parasitic capacitance between a gate and a source/drain (FIG. 1), may not shrink correspondingly, which accounts for an increasing proportion in the total capacitance, resulting in a severe influence on the transient response of the device.

On the other hand, short channel effect (SCE), which manifest itself as the threshold voltage roll-off, increased subthreshold slope and subthreshold leakage current etc., has become an important issue, when the device enters into a deep submicron regime In order to mitigate SCE, a conventional planar transistor can be reformed by a novel structure. Due to a surrounding gate structure and a channel diameter in nanometer regime, a surrounding gate silicon nanowire transistor has a very excellent capability in controlling the short channel effect, which is a promising novel device structure to replace the conventional planar transistor in the case of a very short channel. Since the channel diameter of the surrounding gate nanowire transistor is in a nanometer regime, its intrinsic capacitance is very small, however, the fringing capacitance from the gate to the source/drain is comparatively large (FIG. 2). As a result, the parasitic capacitance has more significant influence on the transient response compared with that of the planar transistor.

The fringing capacitance between the gate and the source/drain region can be reduced by using material with a low dielectric constant as spacers. Since the air has a very low dielectric constant, it can be perceived that the surrounding gate nanowire transistor using air as sidewalls will has smaller parasitic capacitance. FIG. 3 is a schematic diagram of a surrounding gate nanowire transistor using conventional $SiO_2$ spacers and air spacers. FIGS. 4 and 5 are the cross section views of the device taken along the line AA' and line BB'. FIGS. 6(a) and 6(b) are the schematic diagrams of the surrounding gate nanowire transistor with a channel length of 20 nm, a nanowire diameter of 10 nm, and a spacer thickness of 10 nm using conventional $SiO_2$ spacers and air spacers, respectively. FIG. 6(c) is the comparison of their gate capacitances, and it is shown that the parasitic capacitance is largely reduced by using air spacers.

So far, the experiment research on the surrounding gate nanowire transistor is mainly focused on the process integration, electrical characterization, and device optimization to reduce parasitic resistance. However, there is no report on the optimization for parasitic capacitance in this device. Furthermore, due to a special three dimensional structure of the nanowire, how to form air sidewalls needs a special design of process flow. And this has not been reported by now.

SUMMARY OF THE INVENTION

A purpose of the present invention is to provide a fabrication method for a surrounding gate silicon nanowire transistor with air as spacers, the transistor is fabricated on a SOI (silicon-on-insulator) substrate.

A technical solution proposed by the present invention is as follows:

A fabrication method for a surrounding gate silicon nanowire transistor with air as spacers is characterized in that, the transistor is fabricated on a SOT (silicon-on-insulator) substrate, and the method comprises the following steps:

1) Performing an isolation process;
2) Depositing a material A (such as, SiN, $SiO_2$, etc), which has a high etching selectivity ratio with respect to Si;
3) Performing photolithography to define a Fin hard mask;
4) Etching the material A, transferring a pattern of photoresist onto the material A to form the Fin bar hard mask;
5) Performing source and drain implantation;
6) Performing photolithography to define a channel region and large source/drain regions;
7) Etching the silicon using the photoresist and the Fin hard mask of the material A as barriers, so as to form the Si Fin and the large source/drains;
8) Removing the hard mask of the material A;
9) Performing oxidization to form a nanowire;
10) Etching the $SiO_2$ through isotropic wet etching to form a floating nanowire;
11) Forming a gate oxide;
12) Depositing a polysilicon;
13) Performing polysilicon implantation;
14) Performing annealing to activate the dopants;
15) Etching the polysilicon until the polysilicon thickness on the source/drain is around 30 to 50 nm;
16) Depositing SiN;
17) Performing photolithography to define a gate pattern;
18) Etching the SiN and the polysilicon, transferring the pattern of the photoresist onto the polysilicon to form the gate pattern;
19) etching the polysilicon through isotropic dry etching or isotropic wet etching, to separate the gate and the source/drain with a space filled with air therein;
20) Depositing $SiO_2$ to form air spacers;
21) Performing annealing to densify the $SiO_2$ layer;
22) Using subsequent CMOS backend processes to complete the device fabrication.

In the step 1), the isolation is a silicon island isolation or a local oxidation of silicon.

In the steps 4), 7), 15) and 18), an anisotropic dry etching technology is adopted.

In the step 5), an implantation with an angle of 0 degree is adopted.

In the step 8), the SiN is removed by a concentrated phosphoric acid at 170° C.

In the step 9), a dry oxidation or a wet oxidation is adopted.

In the step 10), the $SiO_2$ is removed by using a hydrofluoric acid.

In the step 11), the $SiO_2$ dielectric layer is formed by a dry-oxygen oxidation, or other dielectric layer with a high dielectric constant.

In the steps 2), 12), 16) and 20), a chemical vapor deposition method is adopted.

In the step 19), an isotropic dry etching or an isotropic wet etching is adopted.

The invention has the following advantageous effects in that, the fabrication method for a surrounding gate silicon nanowire transistor with air as spacers according to the invention is compatible with the CMOS process flow. The introduction of the air spacers can effectively reduce the parasitic capacitance of the device, and improve the transient response of the device, so that the method is applicable for a logic circuit with high performance.

1—Si; 2—buried oxide layer; 3—SiN; 4—$SiO_2$; 5—polysilicon; 6—air.

DETAILED DESCRIPTION OF THE EMBODIMENTS

The invention is further described with reference to the accompany drawings and specific embodiments.

Figure 1:
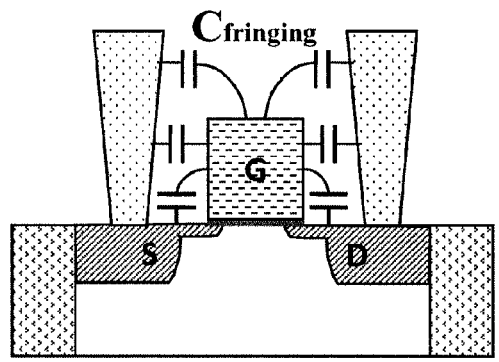
FIG. 1 is a schematic diagram of a fringing capacitance between a gate and a source/drain.
Figure 2:
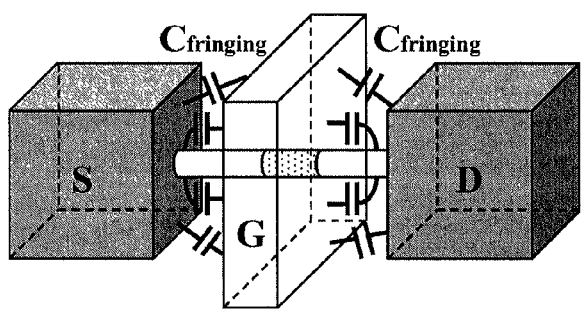
FIG. 2 is a schematic diagram of a fringing capacitance of a surrounding gate silicon nanowire device.
Figure 3:
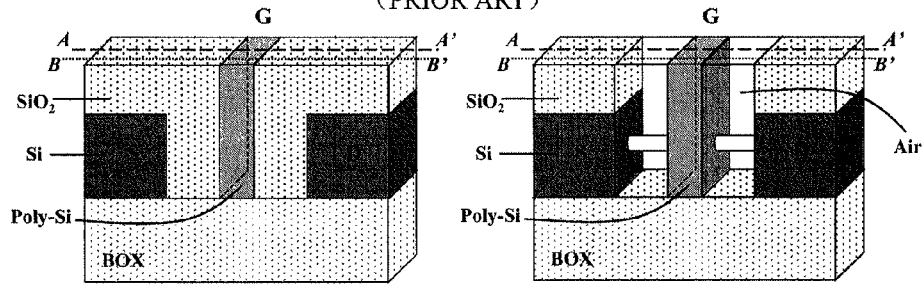
FIG. 3 is a surrounding gate silicon nanowire device with $SiO_2$ and air as spacers.
Figure 4:
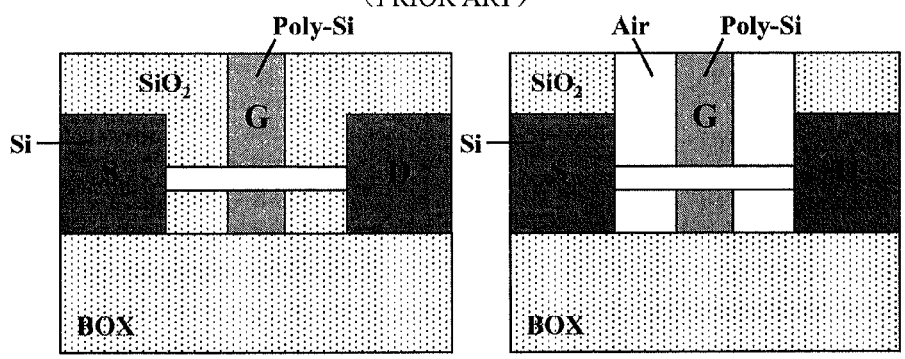
FIG. 4 is a cross section view of a surrounding gate silicon nanowire device with $SiO_2$ and air as spacers taken along the line AA'.
Figure 5:
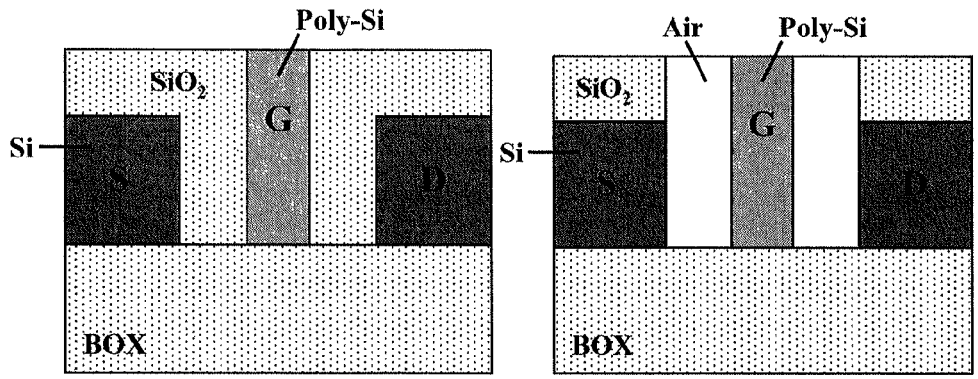
FIG. 5 is a cross section view of a surrounding gate silicon nanowire device with $SiO_2$ and air as spacers taken along the line BB'.
Figure 6:
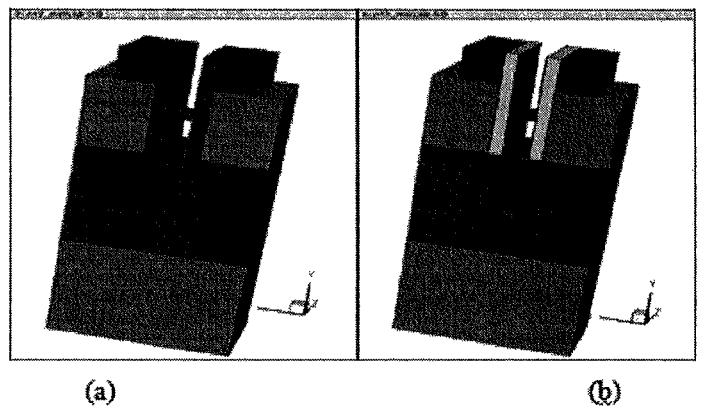
FIGS. 6(a) and 6(b) are the schematic diagrams of the surrounding gate nanowire using $SiO_2$ spacers and air spacers, respectively.
FIG. 6(c) is a graph showing their gate capacitance.
Figure 6:
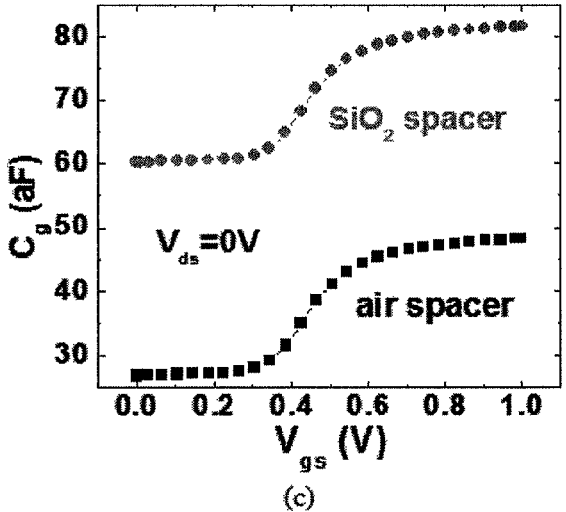
Figure 7:
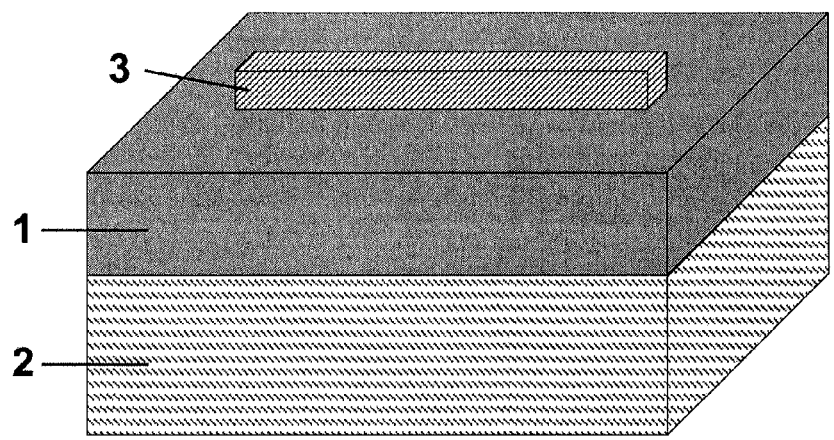
FIGS. 7 to 16 are process flow diagrams of an embodiment, in which reference numbers of the respective material layer are as follows.
Figure 8:
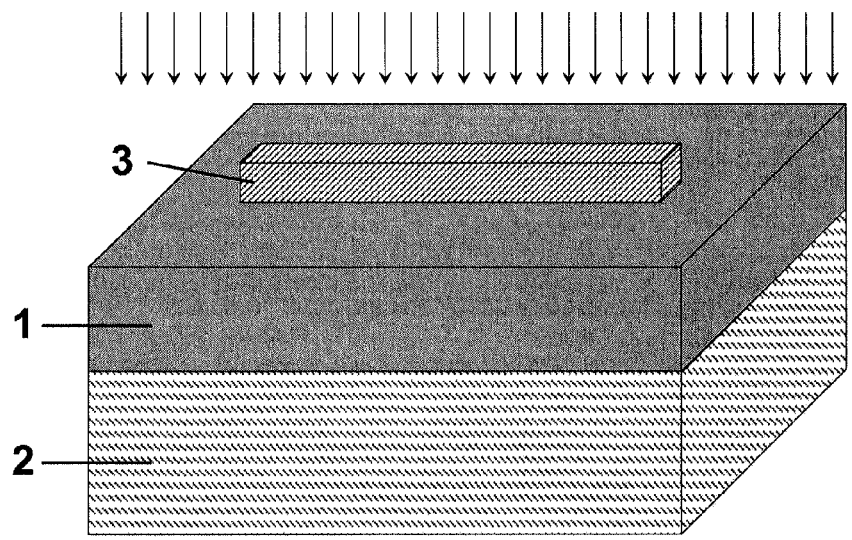
Figure 9:
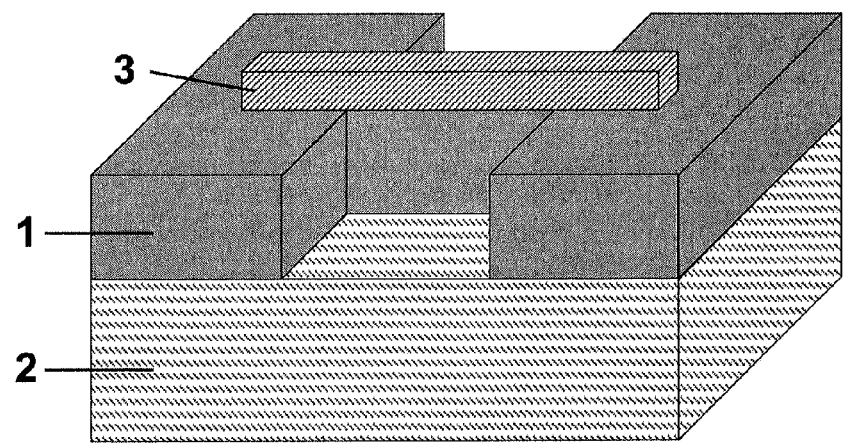
Figure 10:
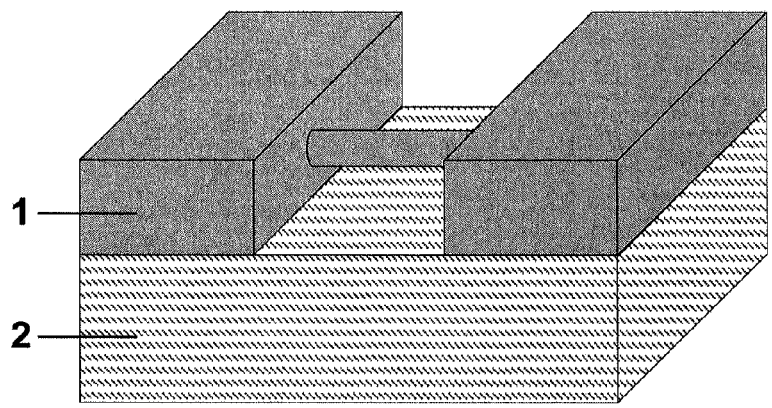
Figure 11:
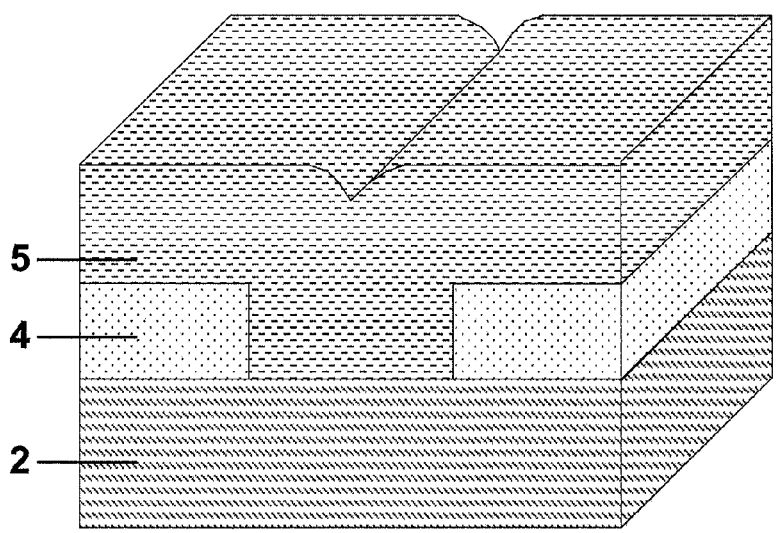
Figure 12:
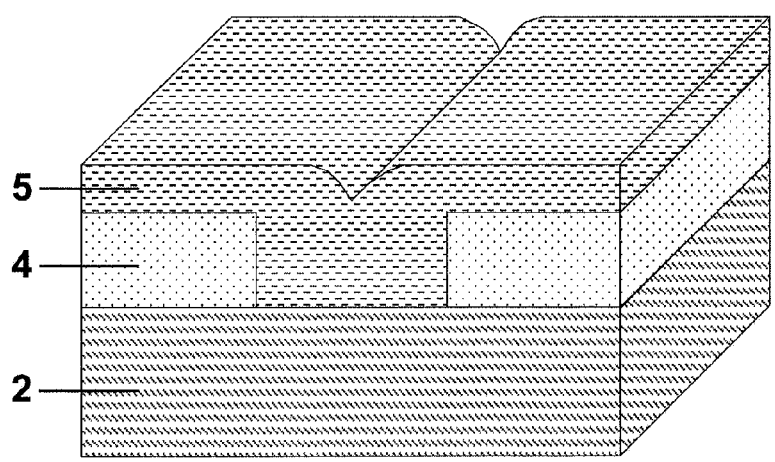
Figure 13:
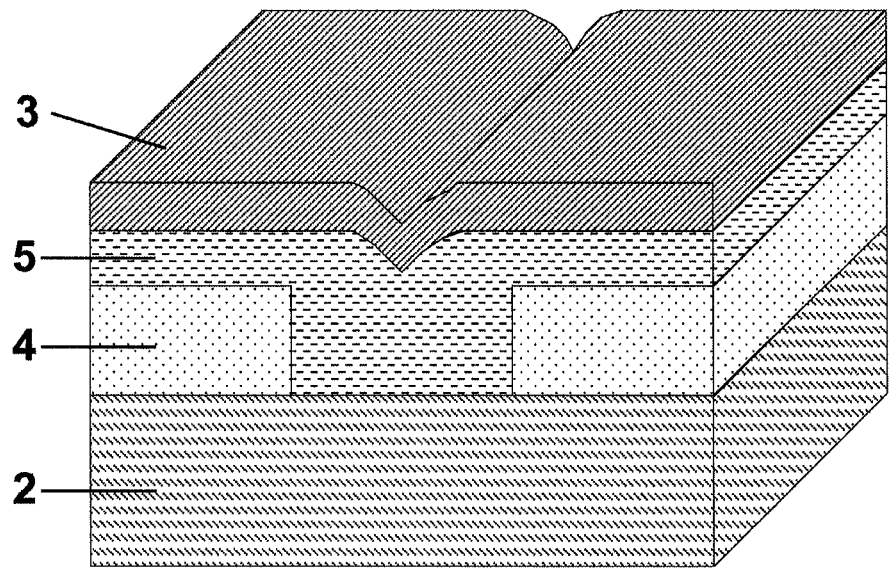
Figure 14:
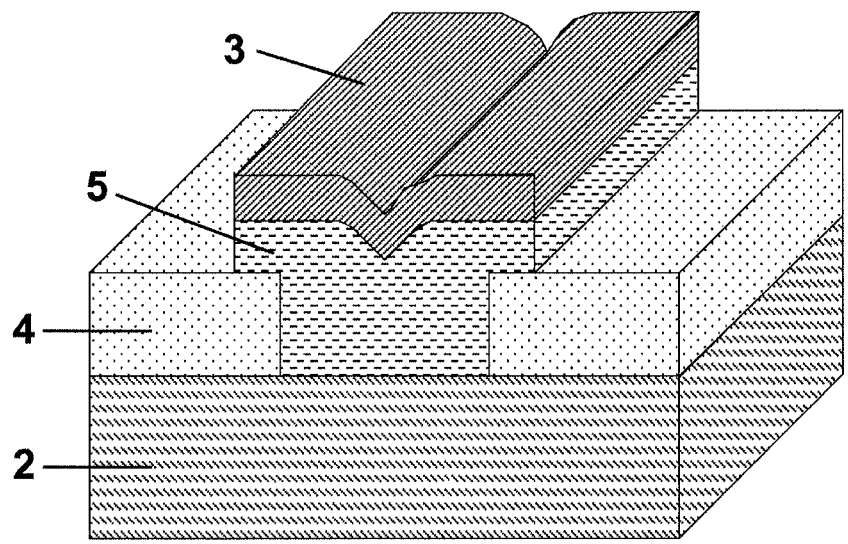
Figure 15:
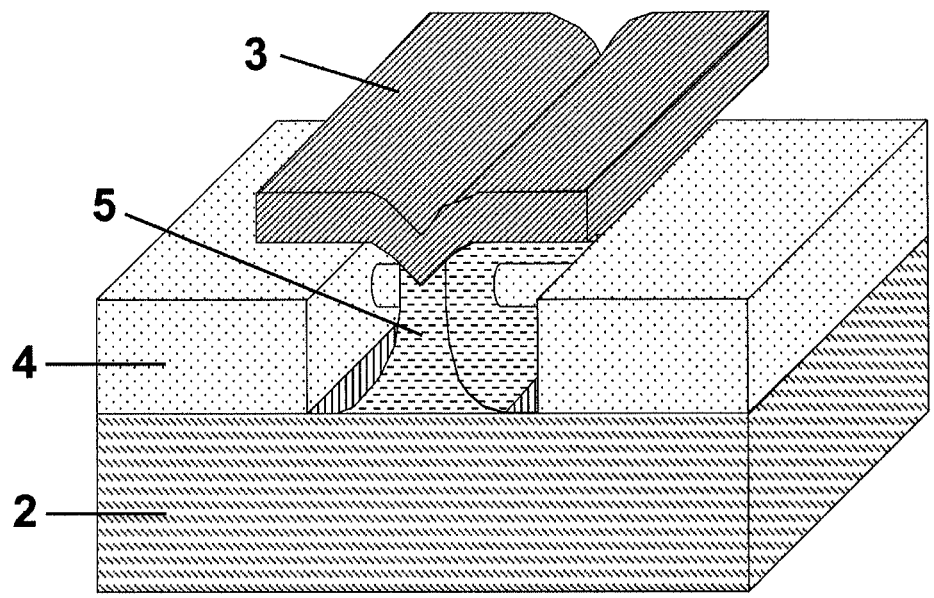
Figure 16:
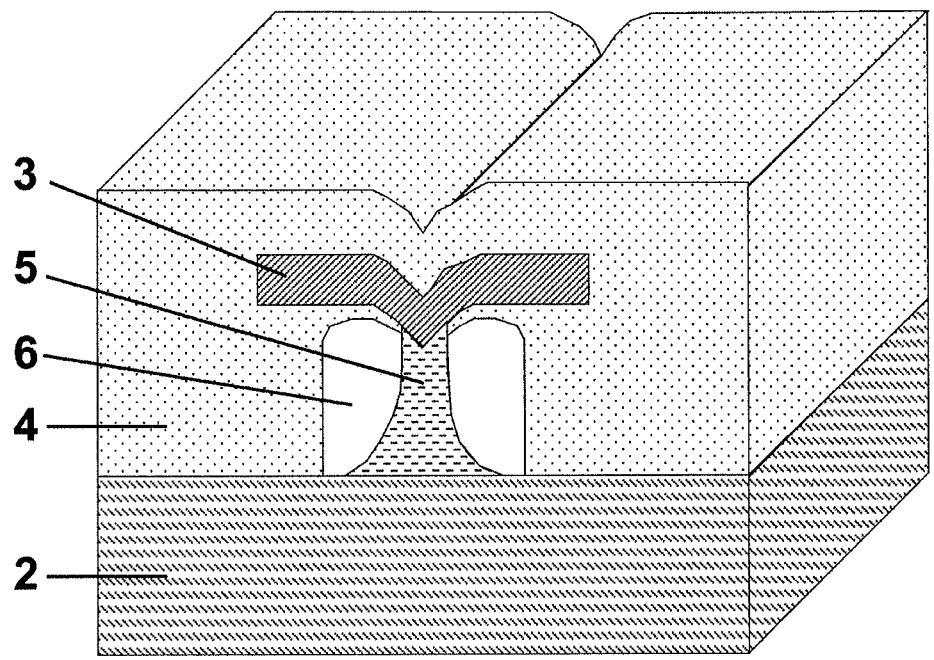

Embodiment 1 starting from a SOI substrate (Si having a thickness of 2500 Å on a buried oxide layer), sequentially performing the following steps:

1. A silicon island isolation method is adopted;
2. A SiN 3 with a thickness of 1500 Å is deposited by using a low pressure chemical vapor deposition (LPCVD);
3. Photolithography is performed to define a Fin hard mask;
4. The SiN 3 is etched by 1500 Å through a reactive ion etching (RIE) technology, and then the photoresist is removed by cleaning, as shown in FIG. 7;
5. An As implantation is performed with a 0° angle, an energy of 50 KeV, and a dosage of $4\times10^{15}$ cm$^{-2}$, as shown in FIG. 8;
6. A photolithography is performed to define a channel region and large source/drain regions;
7. The Si 1 is etched by 2500 Å through inductively coupled plasma (ICP), by using the photoresist and the SiN Fin hard mask as barriers, so that the Fin and the large source/drain are formed, and is then cleaned to remove the photoresist, as shown in FIG. 9;
8. The SiN 3 is selectively etched by a concentrated phosphoric acid at 170° C., and the SiN hard mask is completely removed;
9. A dry-oxygen oxidation is performed to form a silicon nanowire;
10. The $SiO_2$ 4 formed by the dry oxidation is etched by a buffering hydrofluoric acid, to form floating silicon nanowires;
11. The gate is oxidized to form a gate oxide layer with a thickness of 5 nm;
12. A polysilicon 5 with a thickness of 4000 Å is deposited by using a low pressure chemical vapor deposition (LPCVD), as shown in FIG. 11;
13. An As implantation is performed with an energy of 80 KeV and a dosage of $8\times10^{15}$ cm$^{-2}$;
14. A rapid thermal processing (RTP) is performed for 10s in nitrogen, at a temperature of 1050° C., to activate dopants;
15. The polysilicon 5 is etched by a reactive ion etching (RIB) by a thickness of 3700 Å-3500 Å, as shown in FIG. 12;
16. A SiN with a thickness of 500 Å is deposited by using a low pressure chemical vapor deposition (LPCVD);
17. Photolithography is performed to define a gate pattern;
18. The SiN is etched by 500 Å through a reactive ion etching (RIB), and the polysilicon is etched through inductively coupled plasma (ICP) until the polysilicon over the source/drain is etched and cleaned, as shown in FIG. 14;
19. The polysilicon is etched through isotropic etching by a HNA solution to separate the gate and the source/drain with a space in between filled with air;
20. A $SiO_2$ with a thickness of 4000 Å is deposited by using a low pressure chemical vapor deposition (LPCVD) to form air spacers;
21. A rapid thermal processing (RIP) is performed for 5s in nitrogen, at the temperature of 1050° C., to densify the oxide layer;
22. Photolithography is performed to define a metal contact hole;
23. The $SiO_2$ is etched by 4000 Å through a reactive ion etching (RIE), the $SiO_2$ remained in the hole is etched by a buffering hydrofluoric acid, and the phoresist is cleaned;
24. Ti/Al of 700 Å/1 µm is sputtered;
25. Photolithography is performed to define a metal wire;
26. Al/Ti is etched by 1 µm/700 Å through a reactive ion etching (RIE);
27. An annealing is performed for 30 minutes in $N_2+H_2$, at a temperature of 430° C., and an alloying is performed to accomplish the device fabrication.

Embodiment 2 as compared with embodiment 1, the difference is in the following steps:

1. A LOCOS isolation method is used;
2. A $SiO_2$ with a thickness of 1500 Å is deposited by using a low pressure chemical vapor deposition (LPCVD);
4. The $SiO_2$ is etched by 1500 Å through a reactive ion etching (RIE) technology, and the photoresist is removed by cleaning;
7. The Si is etched by 2500 Å through inductively coupled plasma (ICP), using the photoresist and the $SiO_2$ Fin hard mask as barriers, so that the Fin and the large source/drain are formed, and then the photoresist is removed by cleaning;
8. The $SiO_2$ is selectively etched by a buffered hydrofluoric acid (BHF) at 170° C., and the $SiO_2$ hard mask is completely removed;
9. A wet oxidation is performed to form a silicon nanowire;
10. The $SiO_2$ formed by wet oxidation is etched by a buffered hydrofluoric acid (BHF) to form a floating silicon nanowire.

What is claimed is:

1. A fabrication method for a surrounding gate silicon nanowire transistor with air as spacers, characterized in that, the transistor is fabricated on a SOI substrate, and the method comprises the following steps:

performing an isolation process on the SOI substrate;

depositing a material A having a relatively high etching selectivity ratio with respect to Si on the SOI substrate, the SOI substrate including Silicon;

performing photolithography on material A to define a Fin hard mask, the performing photolithography creating a pattern of photoresist;

etching the material A and transferring the pattern of photoresist onto the material A to form the Fin hard mask;

performing source and drain implantation on the SOI substrate;

performing photolithography to define a channel region and source/drain large regions on the silicon of the SOI substrate;

etching the silicon by using the pattern of photoresist and the Fin hard mask of the material A as barriers, so as to form the Fin and the large source/drains within the silicon;

removing the hard mask of the material A from the Si on the SOI substrate;

performing oxidization of the silicon on the SOI substrate to form a nanowire;

etching the the oxidized silicon through isotropic wet etching to form a floating nanowire;

forming a gate oxide layer on a gate of the Si on the SOI substrate;

depositing a polysilicon on the silicon of the SOI substrate, including on the large source/drain;

performing polysilicon implantation;

performing annealing to activate dopants of the polysilicon;

etching the polysilicon until a polysilicon thickness of the polysilicon on the source/drain is around 30 to 50 nm;

depositing SiN on to the polysilicon;

performing photolithography to define a gate pattern on the SiN;

etching the SiN and the polysilicon and transferring a second pattern of the photoresist onto the polysilicon to form the gate pattern;

etching the polysilicon through isotropic dry etching or isotropic wet etching, to separate the gate and the source/drain with a space in between filled with air;

depositing $SiO_2$ on to the SiN and polysilicon to form air sidewalls;

performing annealing to densify the $SiO_2$ layer;

using CMOS backend processes to complete the device fabrication.

2. The fabrication method of claim 1, characterized in that, performing the isolation process comprises performing a silicon island isolation or a local oxidation of silicon.

3. The fabrication method of claim 1, characterized in that, etching the material A, the silicon, the polysilicon, the SiN and the polysilicon comprises etching the material A, the silicon, the polysilicon, the SiN and the polysilicon by using an anisotropic dry etching technology.

4. The fabrication method of claim 1, characterized in that, performing source and drain implantation comprising performing an implantation with an angle of 0 degree.

5. The fabrication method of claim 1, characterized in that, removing the hard mask of the material A comprises removing the SiN by a concentrated phosphoric acid at 170° C.

6. The fabrication method of claim 1, characterized in that performing oxidization comprises performing a dry oxidation or a wet oxidation.

7. The fabrication method of claim 1, characterized in that the oxidized silicon is removed by using a hydrofluoric acid.

8. The fabrication method as in claim 1, characterized in that, forming the gate oxide layer comprises forming a silicon dioxide layer dielectric layer by a dry oxidation, or other dielectric layer with a high dielectric constant.

9. The fabrication method as in claim 1, characterized in that, depositing the material A, the polysilicon, SiN, $SiO_2$ comprises depositing the material A, the polysilicon, SiN, $SiO_2$ by using a chemical vapor deposition method.

* * * * *